(12) United States Patent
Fujimoto

(10) Patent No.: US 8,017,468 B2
(45) Date of Patent: Sep. 13, 2011

(54) SEMICONDUCTOR DEVICE MANUFACTURING METHOD, AND SEMICONDUCTOR DEVICE

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 319 days.

(21) Appl. No.: 12/349,595

(22) Filed: Jan. 7, 2009

(65) Prior Publication Data
US 2009/0184367 A1    Jul. 23, 2009

(30) Foreign Application Priority Data
Jan. 18, 2008   (JP) ................................ 2008-009277

(51) Int. Cl.
*H01L 21/22*    (2006.01)

(52) U.S. Cl. ......... 438/212; 438/587; 438/589; 438/682

(58) Field of Classification Search .................. 257/329, 257/E21.135, E27.06, E21.657, E21.658; 438/212, 586–587, 589, 682
See application file for complete search history.

(56) References Cited

U.S. PATENT DOCUMENTS
7,829,419 B2 * 11/2010 Tanaka .......................... 438/279

FOREIGN PATENT DOCUMENTS
JP    2005-19741    1/2005

* cited by examiner

*Primary Examiner* — David Vu
*Assistant Examiner* — David Ziskind
(74) *Attorney, Agent, or Firm* — Young & Thompson

(57) ABSTRACT

A method of manufacturing a semiconductor device in which the formation of buried wiring is facilitated includes: forming columnar patterns, which are arranged in a two-dimensional array, and bridge patterns, which connect the columnar patterns in a column direction, on a main surface of a silicon substrate; injecting an impurity in a surface portion of each of the columnar patterns and bridge patterns and in surface portions of the silicon substrate, thereby forming impurity injection layers; forming a side wall on sides of the columnar patterns and bridge patterns; removing the impurity injection layer, which has been formed in the silicon substrate, with the exception of the impurity injection layer covered by the bottom portions of the side walls; removing the side walls by etch-back; and thermally oxidizing the surface portion of the bridge patterns and then etching away the same. Buried wiring extending in the column direction of the columnar patterns is formed within the silicon substrate.

7 Claims, 17 Drawing Sheets

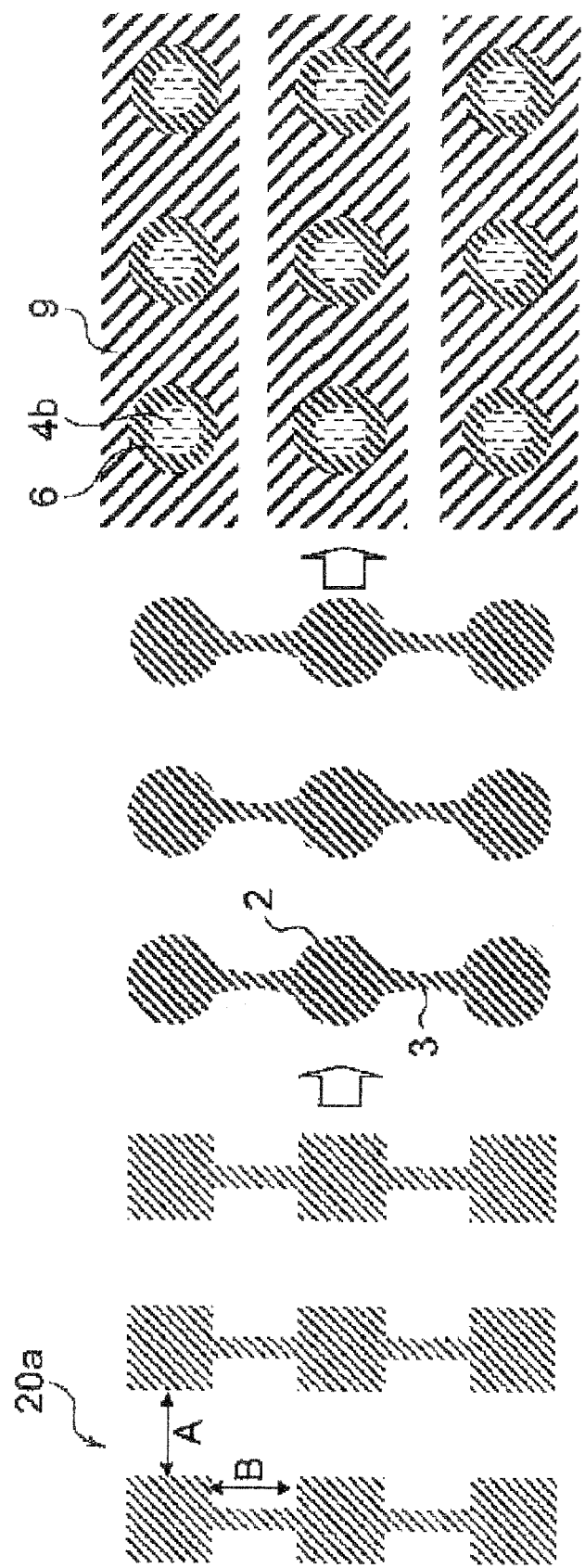

SEMICONDUCTOR DEVICE MANUFACTURING METHOD, AND SEMICONDUCTOR DEVICE

REFERENCE TO RELATED APPLICATION

This application is based upon and claims the benefit of the priority of Japanese patent application No. 2008-009277, filed on Jan. 18, 2008, the disclosure of which is incorporated herein in its entirety by reference thereto.

BACKGROUND OF THE INVENTION

1. Field of the Invention

This invention relates to a method of manufacturing a semiconductor device and to a semiconductor device. More particularly, the invention relates to a method of manufacturing a semiconductor device ideal when injecting an impurity into the lower portion of a device for forming wiring in a vertical transistor, and to a semiconductor device.

2. Description of Related Art

Advances in microfabrication of semiconductor devices in recent years have been accompanied by higher degrees of integration. A vertical transistor (e.g., see Patent Document 1) is known as one example of such a semiconductor device having a high degree of integration. In the case of a vertical transistor, layers of a drain region, channel region and source region are built up on a silicon substrate in the vertical direction, i.e., in a direction perpendicular to the main surface of the silicon substrate. For this reason, the area of the silicon substrate occupied in a vertical transistor can be reduced in comparison with a transistor having a planar structure.

An example of a process for manufacturing buried wiring in a conventional vertical transistor will be described with reference to FIGS. 15 to 17. First, a mask pattern having circular openings arranged in a two-dimensional array as shown in FIG. 15A is formed on a silicon substrate 1 by photolithography. Next, the silicon substrate 1 is etched using the mask pattern as a mask, thereby forming silicon columns (referred to as "columnar patterns" below) 20. FIG. 15B is a sectional view of FIG. 15A taken along line a-a'.

Following the step shown in FIGS. 15A, 15B, a side wall (insulating film) 21 is formed on the side surface of the columnar pattern 20 and an impurity is injected to thereby form an impurity-injection layer 22, as illustrated in FIGS. 16A, 16B. Next, as shown in FIGS. 17A, 17B, a separate sidewall 23 is further formed on the outer side of the side wall 21, after which etching is carried out and the patterning of buried wiring 24. It should be noted that when the etching is performed, the impurity-injection layer 22 that has been formed on the top surface of the columnar pattern 20 is removed.

[Patent Document 1]
Japanese Patent Kokai Publication No. JP2005-19741A

SUMMARY

In order to form the buried wiring 24 in the silicon substrate 1 in the vertical transistor depicted in FIGS. 15 to 17, it is necessary to carry out photolithography using a mask pattern in which spacing B of the two-dimensionally arrayed columnar patterns 20 in the vertical direction (referred to as the "column direction") is smaller than spacing A of the columnar patterns 20 in the horizontal direction (referred to as the "row direction" below). The reason for this is that a buried wiring (here a bit line) 24 is formed in the bottom portion of the plurality of columnar patterns 20 arrayed in the column direction.

When an array having the different spacings A and B is formed, the accuracy of photolithography declines as the pattern becomes finer. As a result, photolithography meets with greater difficulty and it becomes difficult to form the bit line. The vertical transistor described in Patent Document 1 does not take into account the aforesaid problem ascribable to the fact that photolithography is performed using a pattern in which spacing A> spacing B holds.

it is an object of the present invention to provide a method of manufacturing a semiconductor device in which buried wiring can be formed with facility, as well as such a semiconductor device.

According to the present invention, there is provided a method of manufacturing a semiconductor device. The method comprises: forming columnar patterns, which are arranged in a two-dimensional array, and bridge patterns, which connect the columnar patterns in a column direction, on a semiconductor substrate; and injecting an impurity in a top surface portion of each of the columnar patterns and bridge patterns and in exposed surface portions of the semiconductor substrate, thereby forming diffusion regions. The method further comprises: forming a side-wall oxide film that covers side surfaces of the columnar patterns and bridge patterns; removing the diffusion region from the surface portions of the semiconductor substrate with the exception of the diffusion region covered by the side-wall oxide film; and removing the side-wall oxide film. Diffusion regions left on the semiconductor substrate are adopted as column wiring extending in the column direction.

Further, the present invention provides a semiconductor device comprising: a semiconductor substrate; a plurality of columnar patterns comprising a semiconductor arranged in a two-dimensional array on the semiconductor substrate and each having a first diffusion layer at a top portion thereof; a second diffusion layer formed on a surface of the semiconductor substrate, surrounding the periphery of columnar patterns arranged in a column direction and connecting these columnar patterns in the column direction; and gate electrodes formed via insulating film on respective ones of side walls of columnar patterns, which are arranged in a row direction, and interconnected in the row direction.

The meritorious effects of the present invention are summarized as follows.

In accordance with the semiconductor device manufactured according to the method of the present invention, columnar patterns arranged in a two-dimensional array are connected in the column direction by bridge patterns. As a result, the spacing of columnar patterns mutually adjacent in the column direction need not be made smaller than the spacing of columns mutually adjacent in the row direction. Accordingly, buried wiring can be formed easily without sacrificing the accuracy of photolithography.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 9A to 9C are plan views illustrating a state in which a word line has been patterned by photolithography in a case where A B holds and mutually adjacent bit lines are not staggered;

DESCRIPTION OF THE PREFERRED EMBODIMENT

Figure 1:
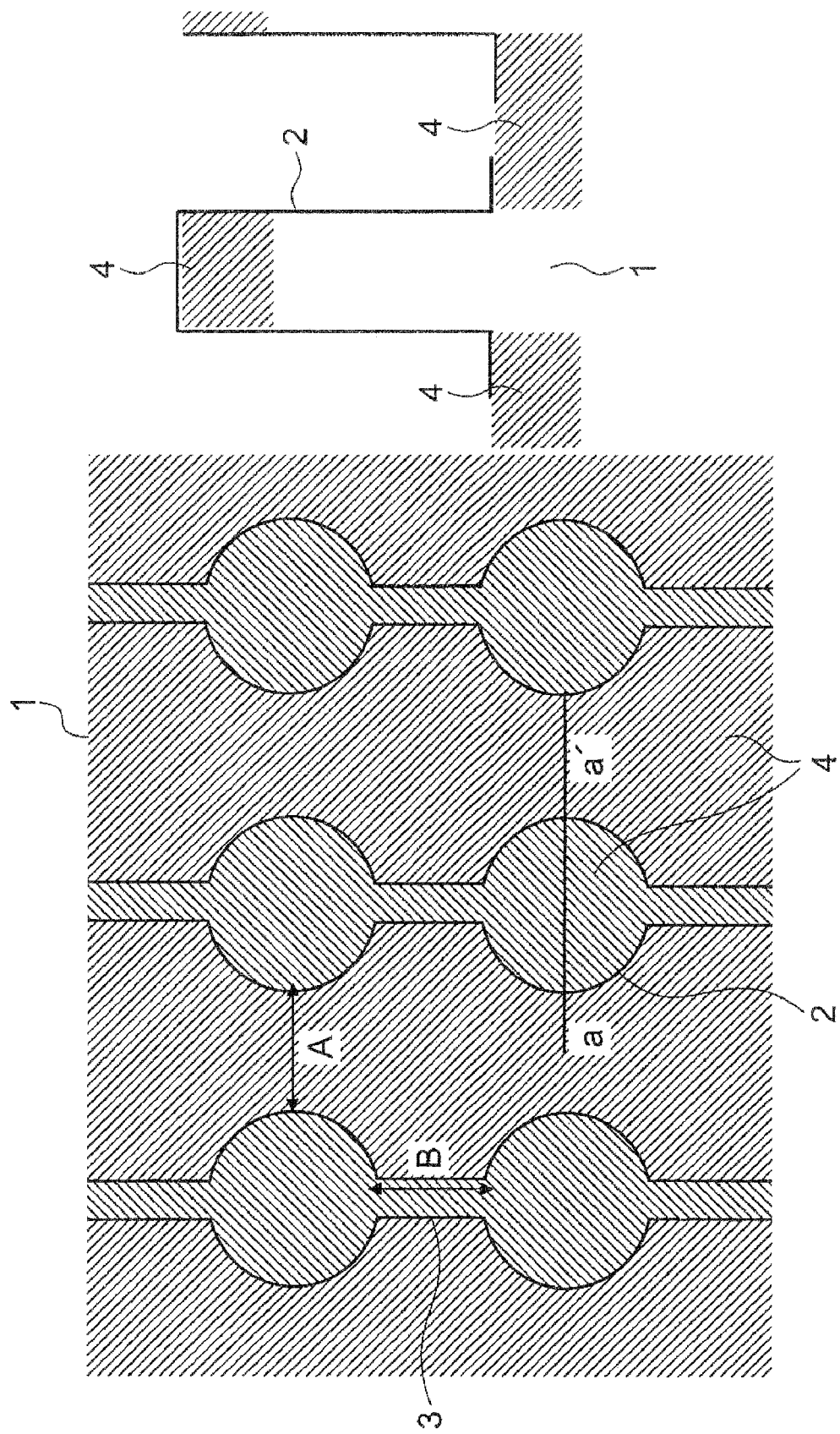
FIGS. 1A and 1B are diagrams illustrating part of a step in a method of forming wiring according to an exemplary embodiment of the present invention.
Figure 2:
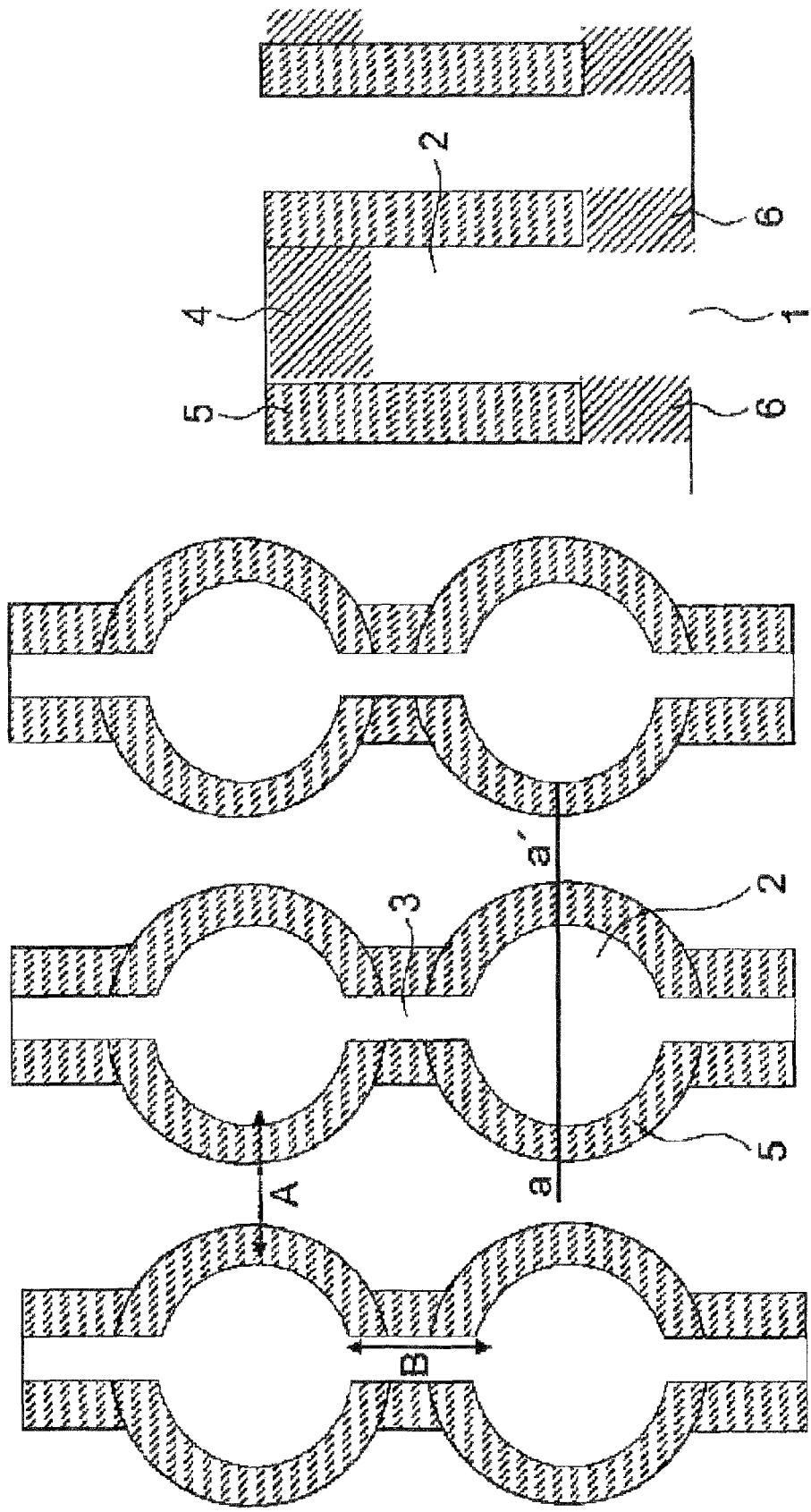
FIGS. 2A and 2B are diagrams illustrating a step of forming a side wall and performing dry etching after the step of FIGS. 1A and 1B.

A preferred exemplary embodiment of the present invention will now be described in detail with reference to the drawings. First, reference will be had to FIGS. 1 to 4 to describe a method of forming embedded wiring, e.g., a bit line, serving also as a diffusion layer of a memory cell included in a semiconductor device. In FIGS. 1 to 4, FIGS. 1A, 2A and 4A are plan views and FIGS. 1B, 2B and 4B are sectional views taken along line a-a' in FIGS. 1A, 2A and 4A, respectively. A semiconductor substrate (referred to as a "silicon substrate" below) 1 is thermally oxidized at 1000° C., for instance, and an oxide film is formed on the surface of the substrate to a thickness of about 10 nm, by way of example. Next, a nitride film is deposited to a thickness of about 150 nm by the CVD (Chemical Vapor Deposition) method, for instance.

Next, the deposited nitride film on the main surface of the silicon substrate 1 is dry-etched in patterns of repeating circular and rectangular portions shown in FIG. 1A, and etching on the order of, e.g., 100 nm is performed using the nitride film as a mask. After etching is performed, the circular portions become columnar patterns 2 arranged in a two-dimensional array, and the rectangular portions become bridge patterns 3 connecting the columnar patterns 2 in the column direction. It should be noted that as long as the bridge patterns 3 can connect the columnar patterns 2 in the column direction, they need not be perfectly rectangular. Further, let separation distance (a second distance) between mutually adjacent columnar patterns 2 in the row direction be a spacing A, and let separation distance (a first distance) between mutually adjacent columnar patterns 2 in the column direction be a spacing B. In this exemplary embodiment it is assumed that A>B holds.

Next, impurity ions are injected in the top-surface portion of the columnar patterns 2 and bridge patterns 3 and in the surface portion(s) of the silicon substrate 1 exposed from the columnar patterns 2 and bridge patterns 3, whereby impurity injection layers 4 are formed. If an N-type diffusion layer is formed at this time, P is injected at 10 KeV at an injection amount of $1E+13/cm^2$, where E denotes "10" and + denotes power.

Next, by depositing an oxide film over the entire surface and performing etching, a side-wall oxide film (side wall 5) is formed on the side surfaces of the columnar patterns 2 and bridge patterns 3 to a thickness on the order of 5 nm, for instance, as illustrated in FIGS. 2A, 2B. Next, as shown in FIG. 2B, the impurity injection layer 4 formed on the top surface of the silicon substrate 1 is removed (e.g. dry-etched) away with the exception of the impurity injection layer 4 covered by the bottom portion of the side wall 5 shown in FIG. 2B (now marked by "6"). The top surface of each columnar pattern 2 is protected at this time by the mask. The dry etching is performed to a thickness on the order of 30 nm, for instance. At this stage, buried wiring 6 extending along the side walls of the columnar patterns 2 and bridge patterns 3 is formed in the bottom portions of the side walls 5, as illustrated in FIG. 2B.

Figure 3:
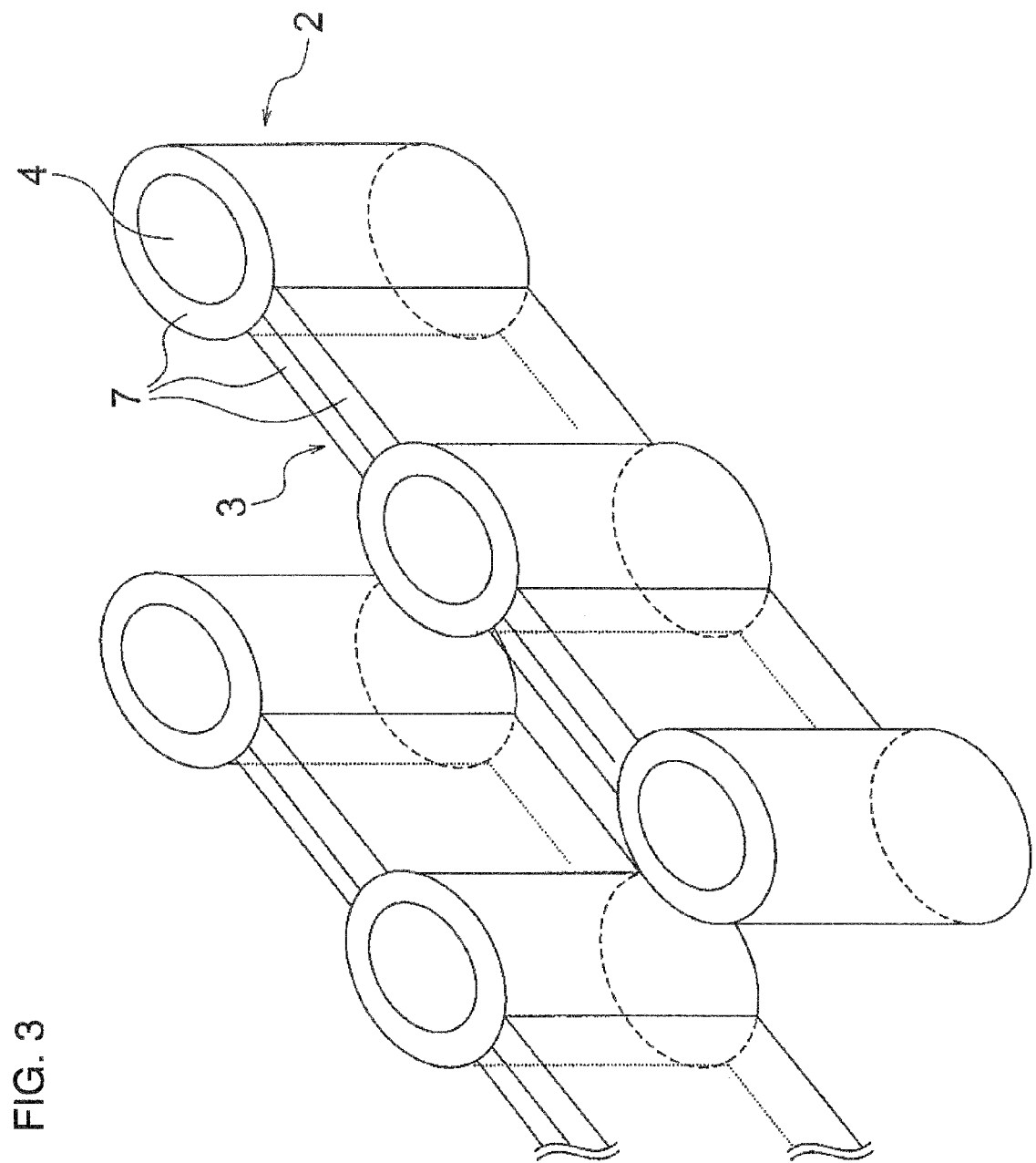
FIG. 3 is a diagram illustrating a step of performing sidewall etching and sacrificial oxidation after the step of FIGS. 2A and 2B.
Figures 4A, 4B:
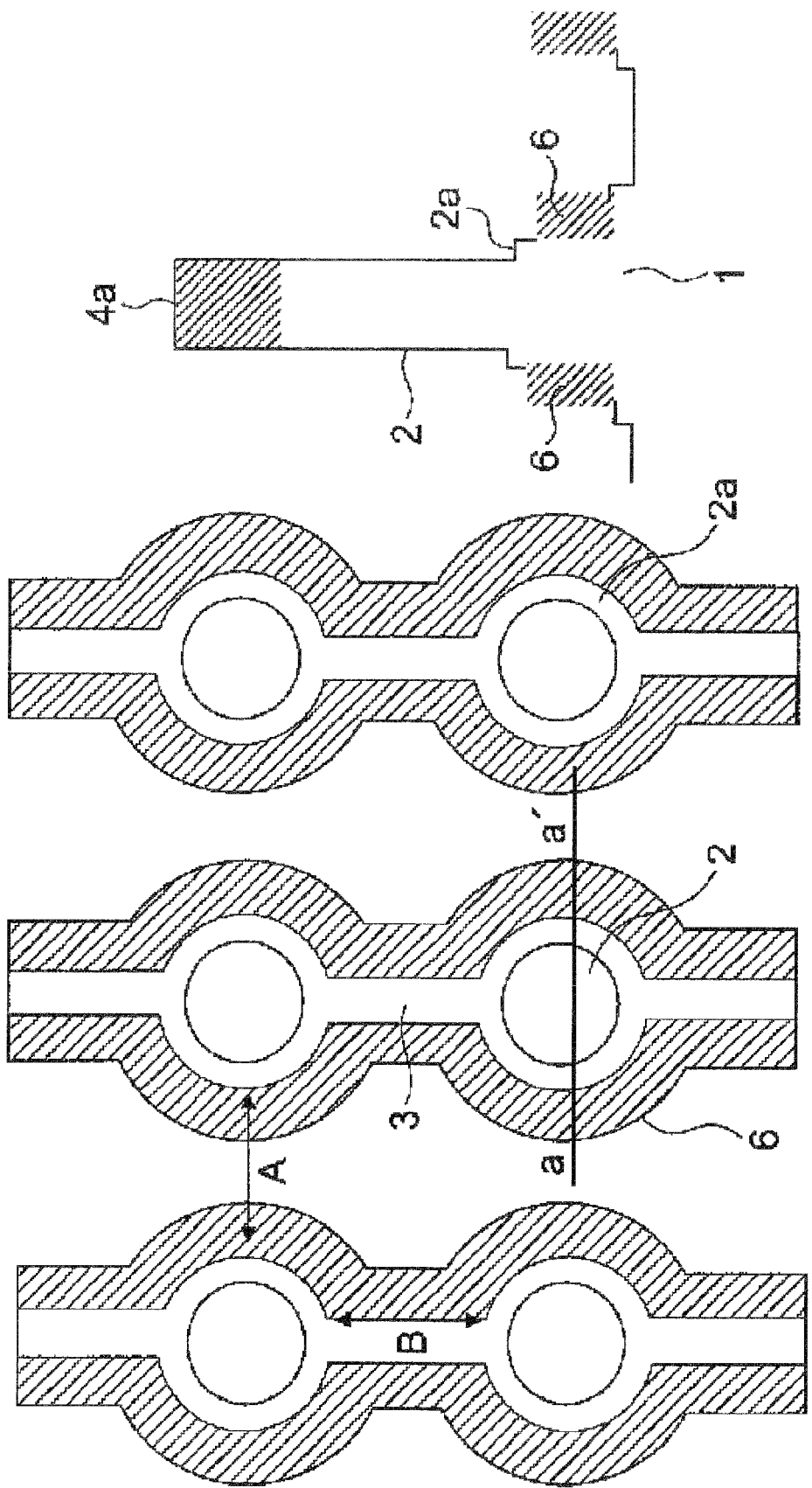
FIGS. 4A and 4B are diagrams illustrating a step of performing oxide-film side-wall etching after the step of FIG. 3.

Next, after the side walls 5 are completely removed (e.g. by wet etching), the silicon of the bridge patterns 3 is completely oxidized from (or thorough) the side walls on both sides by sacrificial oxidation, whereby a thermal oxide film 7 is formed (FIG. 3). It should be noted that when sacrificial oxidation is carried out, there is no change in the height of the columnar patterns 2 before and after sacrificial oxidation because the mask is affixed to the top surface of the columnar patterns 2. Next, the thermal oxide film 7 on the bridge patterns 3 is removed (etched) away to expose the buried wiring 6.

Next, a silicon pattern shown in FIGS. 4A and 4B is obtained by performing, e.g. wet etching of the oxide film. In the silicon pattern, the buried wiring 6 extending along the column direction of the columnar patterns 2 has been formed in the silicon substrate 1, as illustrated in FIG. 4A. Typically, the buried wiring 6 is a bit wire serving also as a lower diffusion layer (drain region). An upper diffusion layer 4a (source/drain region) is formed on the top surface of the columnar patterns 2. Furthermore, the columnar patterns 2 function as channel regions. It should be noted that the columnar patterns 2 in the silicon pattern are slender and the bottom portion of each is formed to have a low columnar portion 2a where impurity injection is not made to form the buried wiring 6.

In this exemplary embodiment, selective etching is performed using a mask pattern for forming the columnar patterns 2 and the bridge patterns 3 that connect the columnar patterns 2 in the column direction. This makes it unnecessary to reduce the spacing B of the columnar patterns 2 mutually adjacent in the column direction. As a result, a decline in the accuracy of photolithography can be avoided. This means that the buried wiring 6 can be formed even though the spacing B of the columnar patterns 2 mutually adjacent in the column direction is not made smaller than the spacing A of the columnar patterns 2 mutually adjacent in the row direction (i.e., even though A>B does not hold). In other words, in accordance with this exemplary embodiment, by using the mask pattern comprising the columnar patterns 2 and the bridge patterns 3 in the case where the buried wiring 6 is formed, the mask pattern is not limited to an A>B mask pattern and an A≅B or A<B mask pattern may be employed (see FIGS. 9 to 14).

Figures 5A, 5B:
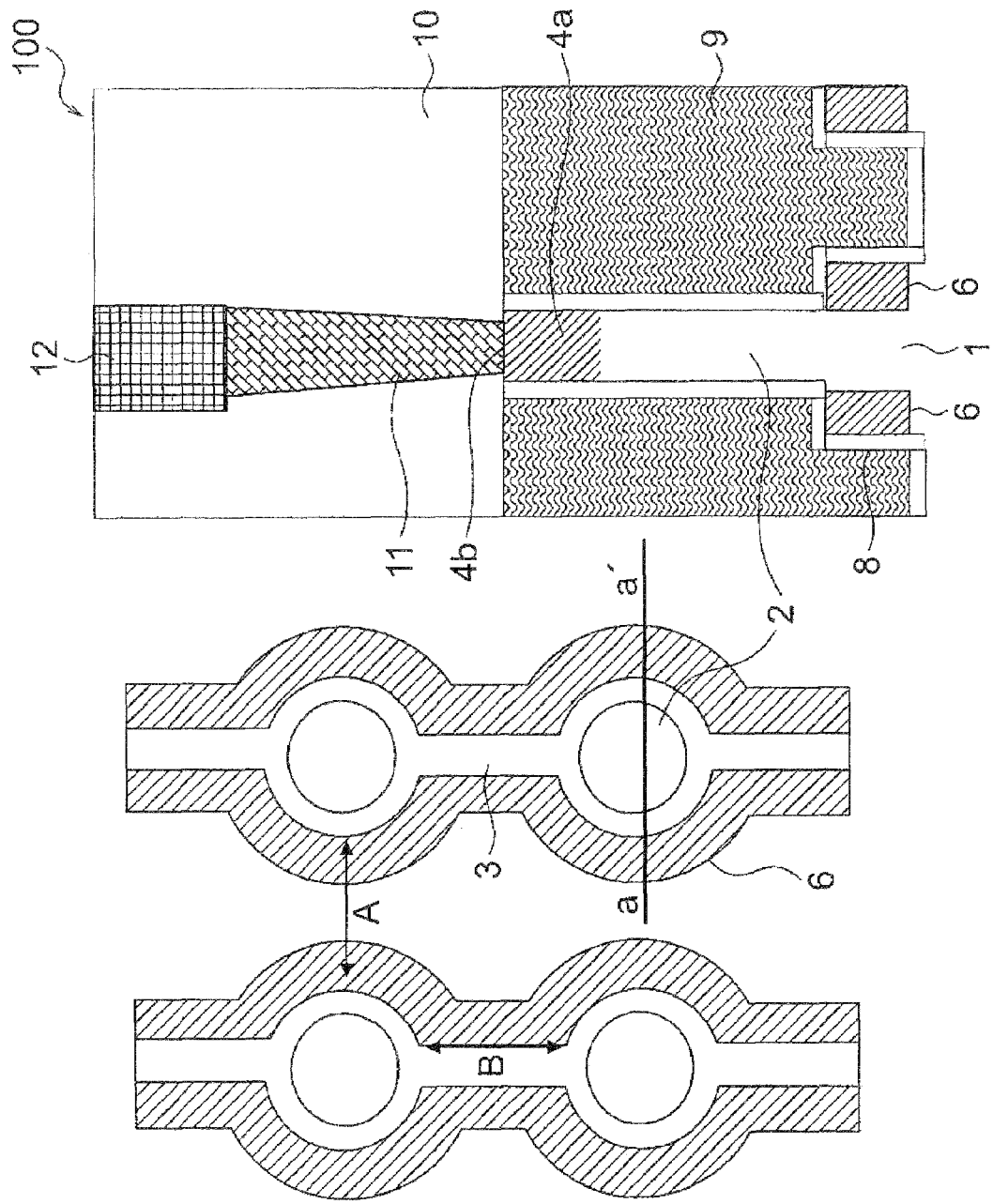
FIGS. 5A and 5B are sectional views illustrating a semiconductor device formed after the steps of FIGS. 4A and 4B.

Thereafter, a semiconductor device 100 shown in FIGS. 5A, 5B is formed by a known method described below. Specifically, in the step of FIGS. 4A, 4B, a contact plug 11 that contacts the upper diffusion layer 4a is formed after a gate oxide film (gate insulating film) 8, gate electrode (typically, as word line) 9 and interlayer insulating film 10 are formed. The contact plug 11 contacts a contact formation region 4b on the upper diffusion layer 4a. Furthermore, a capacitor (or phase change material, etc.) 12 is formed on the top surface of the contact plug 11 and an interlayer insulating film is deposited.

In the semiconductor device 100, the buried wiring (typically, as bit line) 6 serving also as the lower diffusion layer, the columnar patterns 2 serving as channel regions and the upper diffusion layer 4a are built up in the direction perpendicular to the main surface of the silicon substrate 1, as described above, and the gate electrode (word line) 9 is formed via the gate insulating film 8. As a result, a vertical transistor is formed for every columnar pattern 2 in the semiconductor device 100.

Figure 6C:
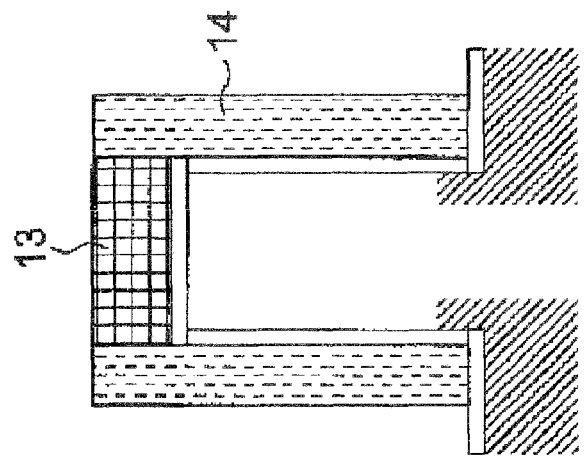
FIGS. 6A to 6C are diagrams illustrating general steps of patterning a word line by photolithography.
Figure 6B:
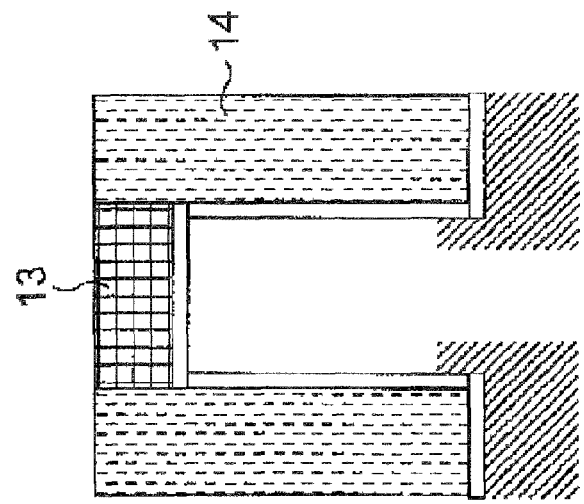
Figure 6A:
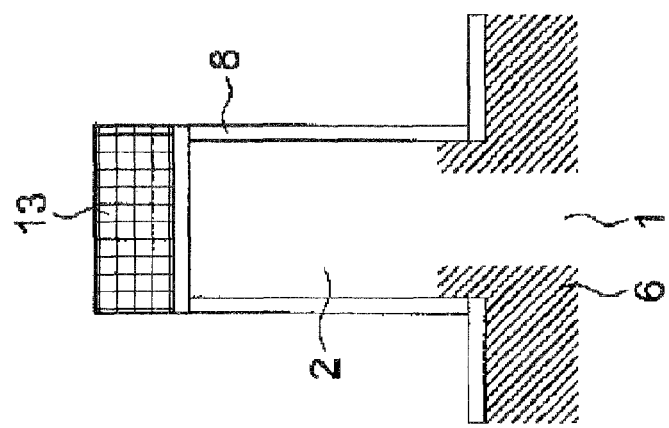

The word line is formed by a method of patterning using photolithography or by a method in which formation is carried out in self-alignment fashion. FIGS. 6A to 6C are diagrams illustrating steps of patterning a word line by photolithography. First, as illustrated in FIG. 6A, by way of example, the silicon oxide film (gate insulating film) 8 is formed by, e.g., the CVD method on the surface portions of the bit line (buried wiring) 6, which serves also as the lower diffusion layer, and silicon column (columnar pattern) 2 serving as the channel region, after which a silicon oxide film 13 is deposited on the top surface of the silicon column 2. Next, as illustrated in FIG. 6B, DOPOS (Doped Polycrystalline Silicon) 14 doped with a conductive impurity is deposited by the CVD method at the time of growth. Next, the DOPOS 14 is flattened by CMP (Chemical Mechanical Polishing) to thereby expose the silicon oxide layer 13. Finally, as shown in FIG. 6C, patterning is carried out by photolithography and the DOPOS 14 is dry-etched, thereby forming the gate electrode (word line).

Figure 7C:
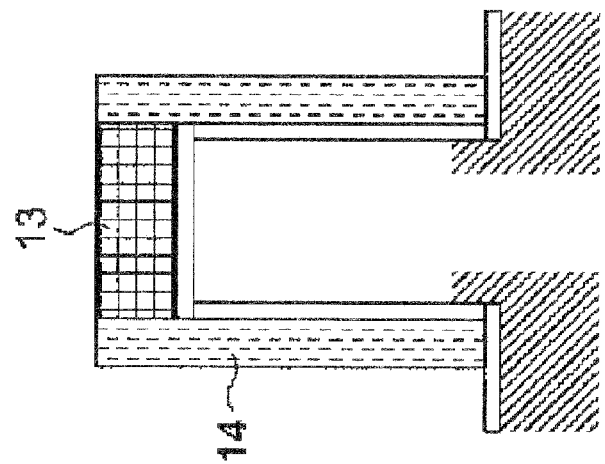
FIGS. 7A to 7C are diagrams illustrating parts of general steps of forming a word line in self-alignment fashion.
Figure 7B:
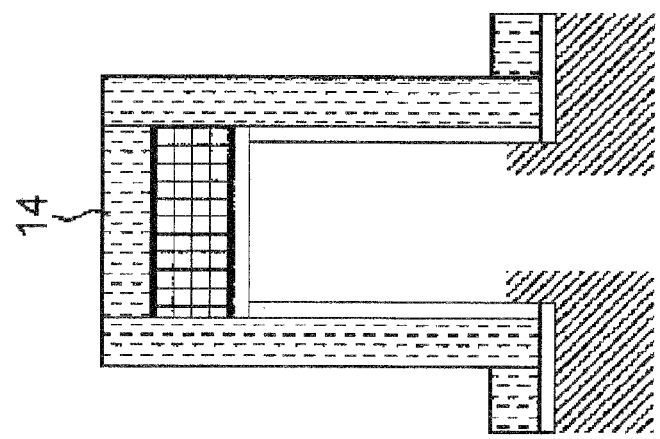
Figure 7A:
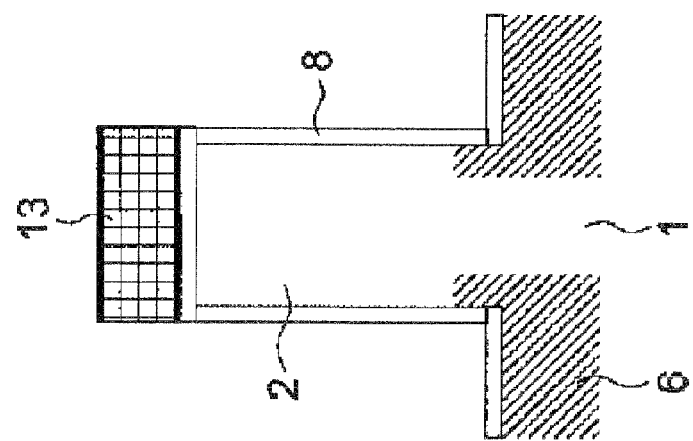

FIGS. 7 and 8 are diagrams illustrating steps for forming a word line in self-alignment fashion. Items similar to those described in conjunction with FIGS. 6A to 6C need not be described again. First, at step 7A in a manner similar to that at step 6A, the silicon oxide layer 13 is deposited on the top surface of the silicon column 2 after the gate insulating film 8 is formed on the surface portions of the bit line 6 and silicon column 2. Next, as illustrated in FIG. 7B, the DOPOS 14 is deposited. Then, as shown in FIG. 7C, the DOPOS 14 is etched back to expose the silicon oxide layer 13.

Figure 8C:
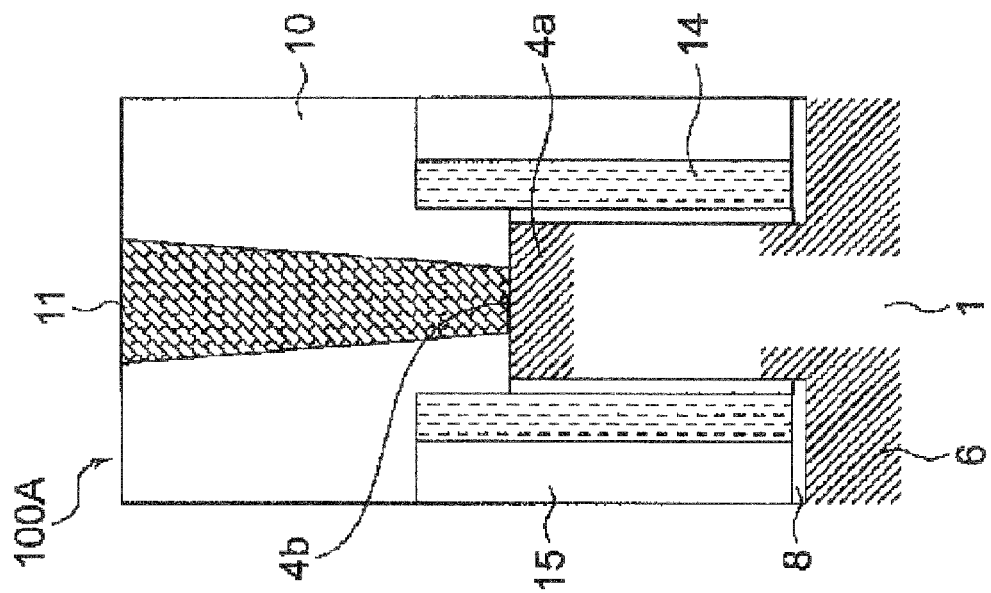
FIGS. 8A and 8C are diagrams illustrating steps of forming a semiconductor device after the steps of FIGS. 7A to 7C.
Figure 8B:
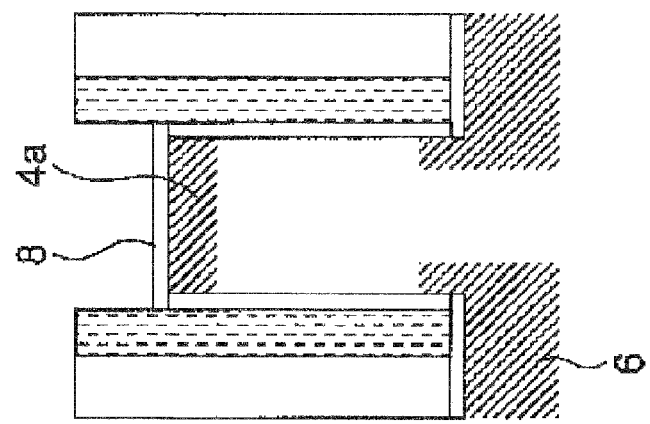
Figure 8A:
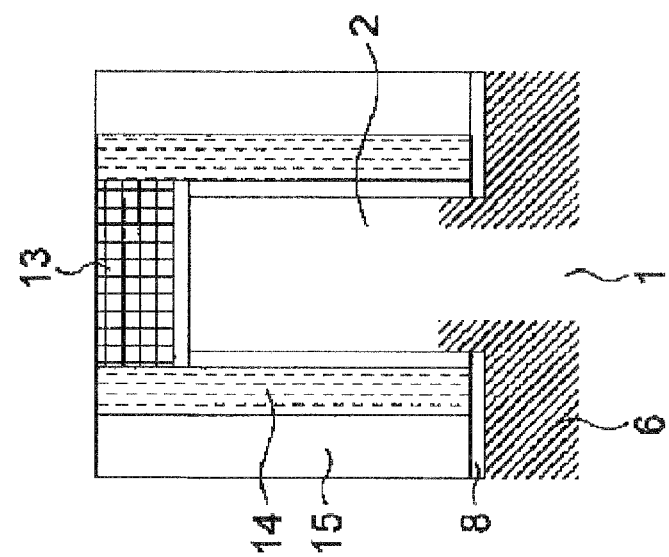

Furthermore, the step shown in FIG. 7C is followed by growing an interlayer insulating film 15 as by the CVD method, performing flattening by the CMP method and exposing the silicon oxide layer 13, as illustrated in FIG. 8A. Next, as shown in FIG. 8B, the exposed silicon oxide layer 13 is removed by wet etching, after which an impurity ion is injected to thereby form the upper diffusion layer 4a. Finally, as shown in FIG. 8C, the gate insulating film 8 on the top surface of the upper diffusion layer 4a is removed, the interlayer insulating film 10 is deposited and the contact plug 11 for making the connection to the contact formation region 4b of the upper diffusion layer 4a is formed. Thus, in the semiconductor device 100A that will be the vertical transistor, the word line is formed in a circle surrounding the columnar pattern 2.

Reference will be had to FIGS. 9 to 12 to describe various shapes of mask patterns in a case where a word line is patterned by photolithography. FIGS. 9A to 12A illustrate mask patterns 20a to 20d, respectively, used in order to form the columnar patterns 2 and bridge patterns 3 by selective etching. FIGS. 9B to 12B illustrate patterns obtained after selective etching is performed using the mask patterns 20a to 20d, respectively. FIGS. 9C to 12C illustrate images of the semiconductor device 100, which is the vertical transistor shown in FIGS. 5A, 5B, as seen from above. Shown in FIGS. 9C to 12C are the contact formation region 4b formed on the upper diffusion layer 4a in order to connect to the contact plug 11, the buried wiring 6 and the word-line formation region (gate electrode) 9.

FIGS. 9A to 9C are plan views illustrating a state in which a word line has been patterned by photolithography in a case where A≅B holds and mutually adjacent bit lines are not staggered. When the A≅B mask pattern 20a is used, the spacing B of the columnar patterns 2 mutually adjacent in the column direction can be enlarged in comparison with a case where the A>B mask pattern shown in FIGS. 1A, 1B is used. As a result, the separation distance of the word-line formation regions 9 mutually adjacent in the column direction can be enlarged, as illustrated in FIG. 9C. This facilitates the working or processing of the word lines.

Figure 10C:
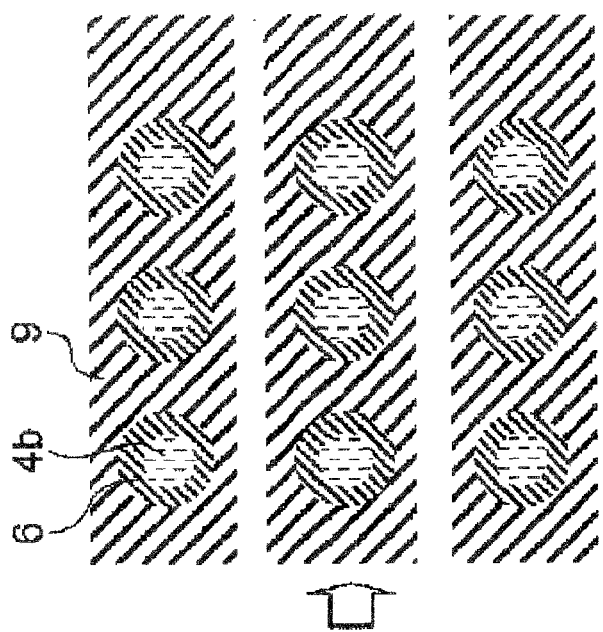
FIGS. 10A to 10C are plan views illustrating a state in which a word line has been patterned by photolithography in a case where A<B holds and mutually adjacent bit lines are not staggered.
Figure 10B:
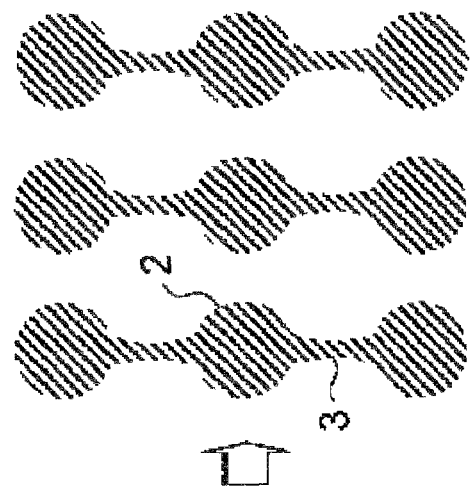
Figure 10A:
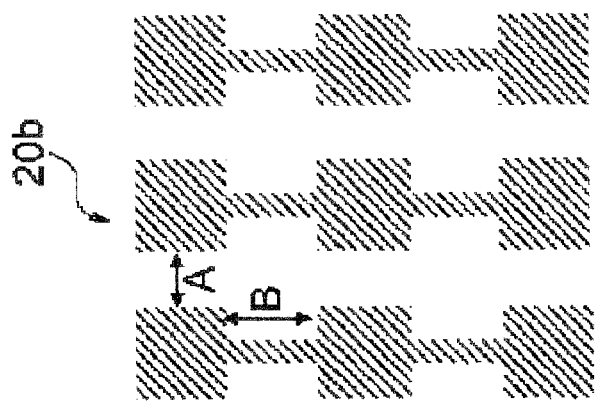

FIGS. 10A to 10C are plan views illustrating a state in which a word line has been patterned by photolithography in a case where A<B holds and mutually adjacent bit lines are not staggered. When the A<B mask pattern 20b is used, the spacing B of the columnar patterns 2 mutually adjacent in the column direction can be enlarged further in comparison with a case where the A≅B mask pattern 20a is used. Accordingly, the separation distance of the word-line formation regions 9 mutually adjacent in the column direction can be enlarged further, as illustrated in FIG. 9C. This further facilitates the working or processing of the word lines.

Figure 11C:
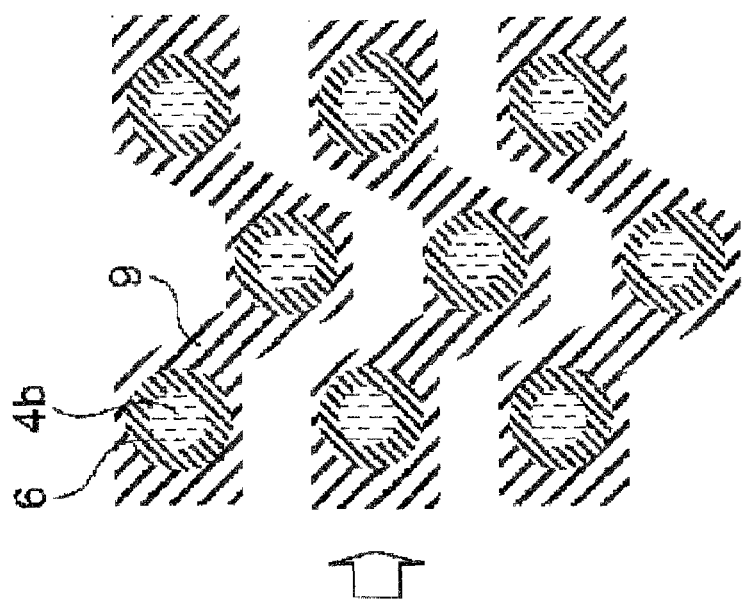
FIGS. 11A to 11C are plan views illustrating a state in which a word line has been patterned by photolithography in a case where A<B holds and mutually adjacent bit lines are staggered by distance B.
Figure 11B:
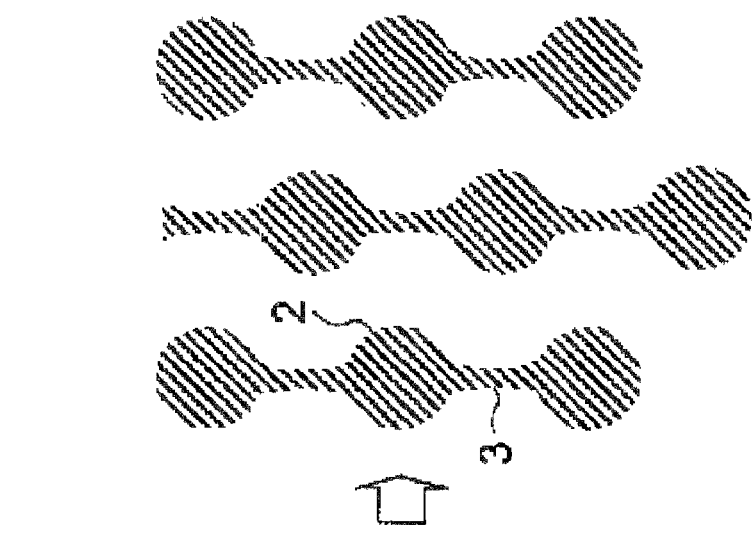
Figure 11A:
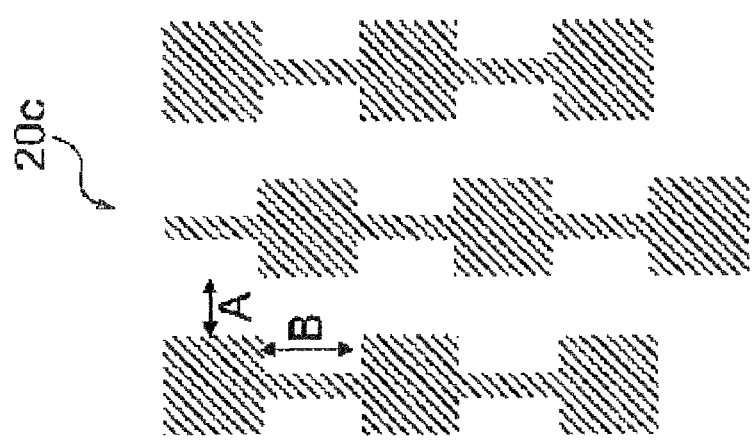

FIGS. 11A to 11C are plan views illustrating a state in which a word line has been patterned by photolithography in a case where A<B holds and mutually adjacent bit lines are staggered (offset) by distance B. By laying out mutually adjacent bit lines staggered by the length B using the mask pattern 20c, the spacing between the contact formation regions 4b can be enlarged, as illustrated in FIG. 11C.

Figure 12A:
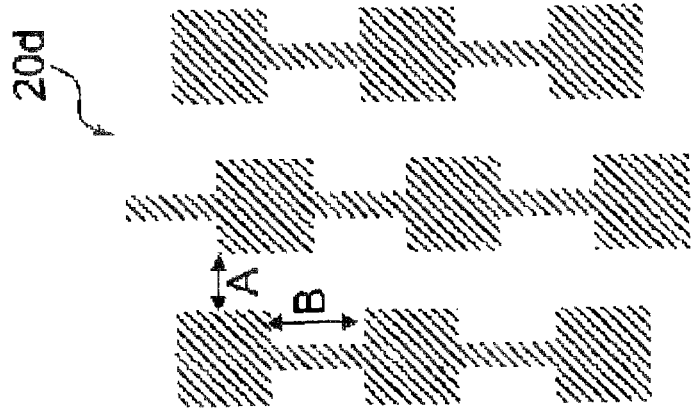
FIGS. 12A to 12C are plan views illustrating a state in which a word line has been patterned by photolithography in a case where A<B holds and mutually adjacent bit lines are staggered by distance B/2.
Figure 12B:
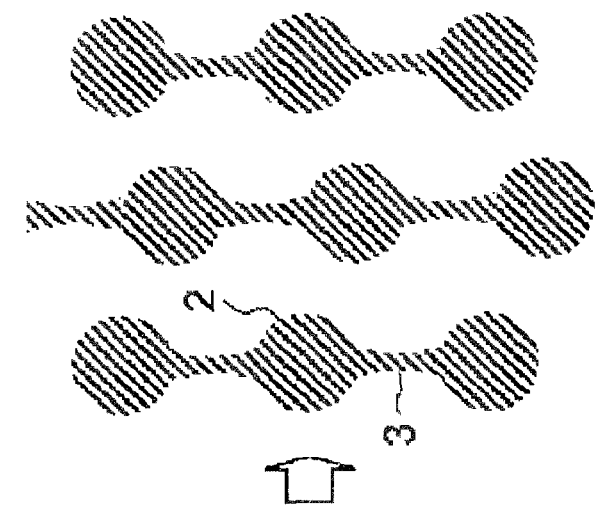
Figure 12C:
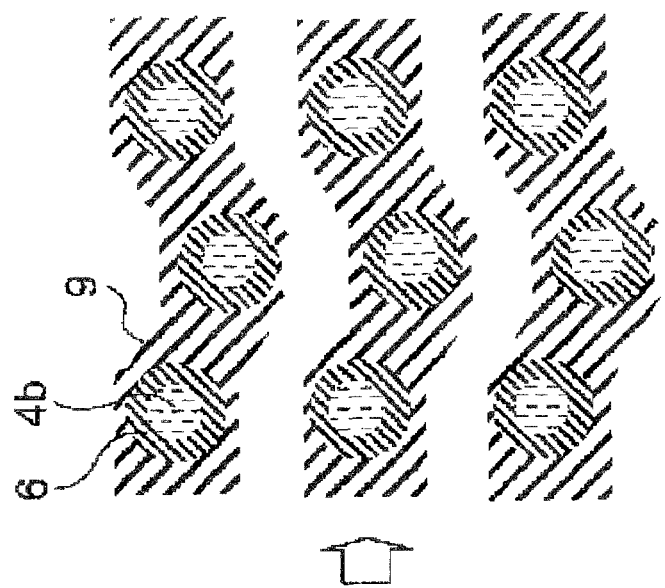

FIGS. 12A to 12C are plan views illustrating a state in which a word line has been patterned by photolithography in a case where A<B holds and mutually adjacent bit lines are staggered (offset) by distance B/2. By laying out mutually adjacent bit lines staggered by the length B/2 using the mask pattern 20d, the spacing between the contact formation regions 4b can be enlarged in comparison with the case where the mask pattern 20b of FIGS. 10A to 10C is used. Further, the spacing of the contact formation regions 4b is reduced and working of the word lines facilitated in comparison with the case where the mask pattern 20c of FIGS. 11A to 11C is used.

Figure 13C:
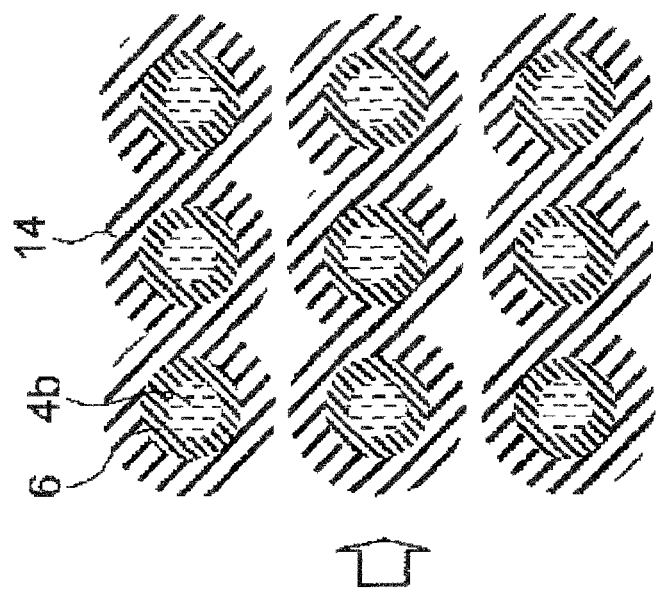
FIGS. 13A to 13C are plan views illustrating a state in which a word line has been formed in self-alignment fashion in a case where A<B holds and mutually adjacent bit lines are not staggered.
Figure 13B:
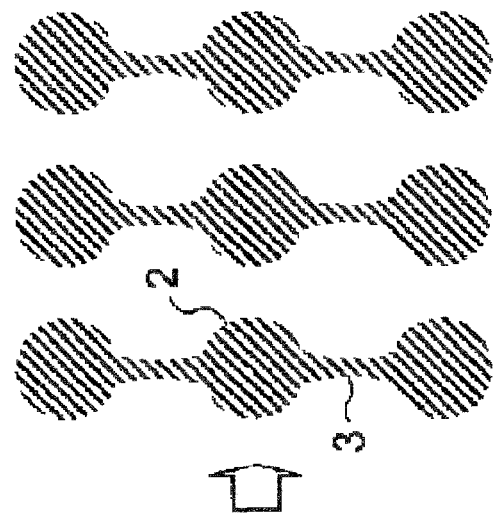
Figure 13A:
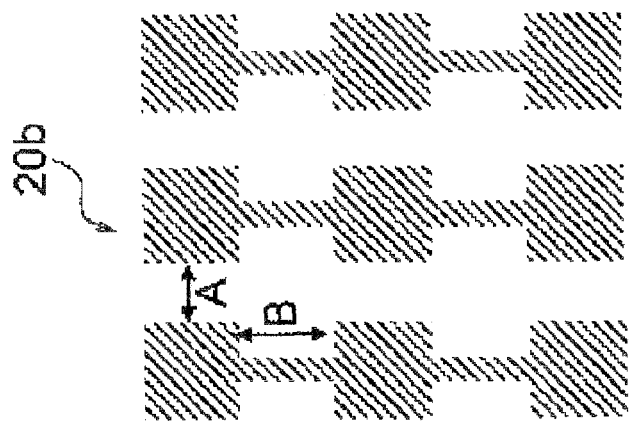
Figure 14C:
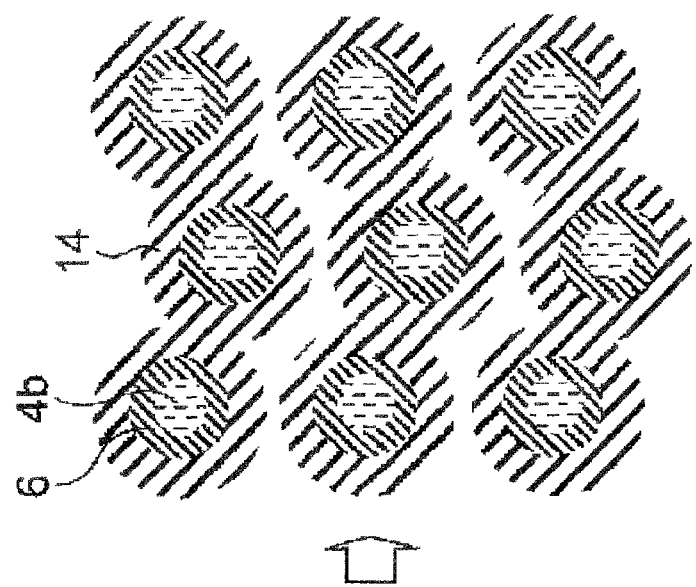
FIGS. 14A to 14C are plan views illustrating a state in which a word line has been formed in self-alignment fashion in a case where A<B holds and mutually adjacent bit lines are staggered by distance B/2.

Reference will be had to FIGS. 13 and 14 to describe various shapes of mask patterns in a case where a word line is formed in self-alignment fashion. FIGS. 13C and 14C illustrate images (concepts) of the semiconductor device 100A, which is the vertical transistor shown in FIG. 8C, as seen from above. Shown in FIGS. 13C and 14C are the contact formation region 4b for connection to the contact plug 11, the buried wiring (bit line) 6 and the word-line formation region (DO-POS) 14 formed in a circle around the columnar pattern 2. FIGS. 13A to 13C are plan views illustrating a state in which a word line has been formed in self-alignment fashion in a case where A<B holds and mutually adjacent bit lines are not staggered. Specifically, since the mask pattern 20b used in FIGS. 13A to 13C is the same as that used in FIGS. 10A to 10C, formation of the word line in self-alignment fashion is facilitated in comparison with the case where the A≅B mask pattern 20a is used.

Figure 14B:
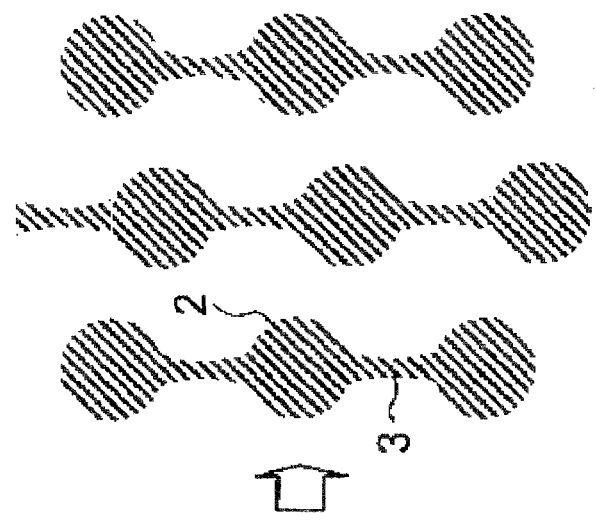
Figure 14A:
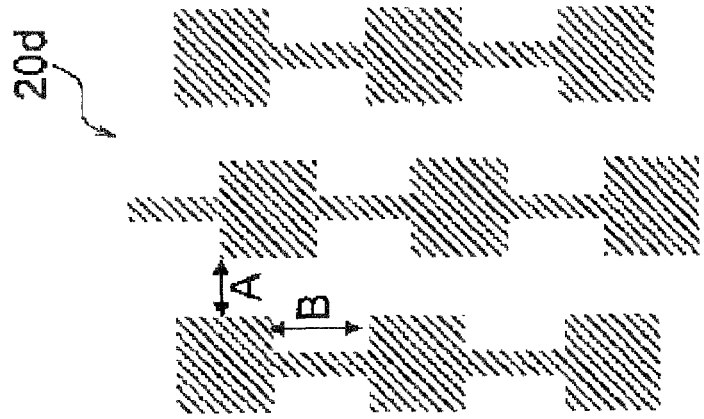
Figure 15B:
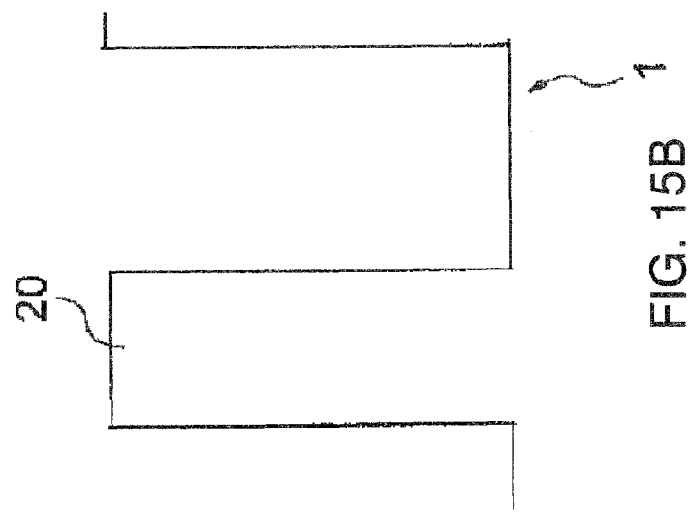
FIGS. 15A and 15B are diagrams for illustrating parts of steps of an example of a process for manufacturing a conventional semiconductor device as a comparative case.
Figure 15A:
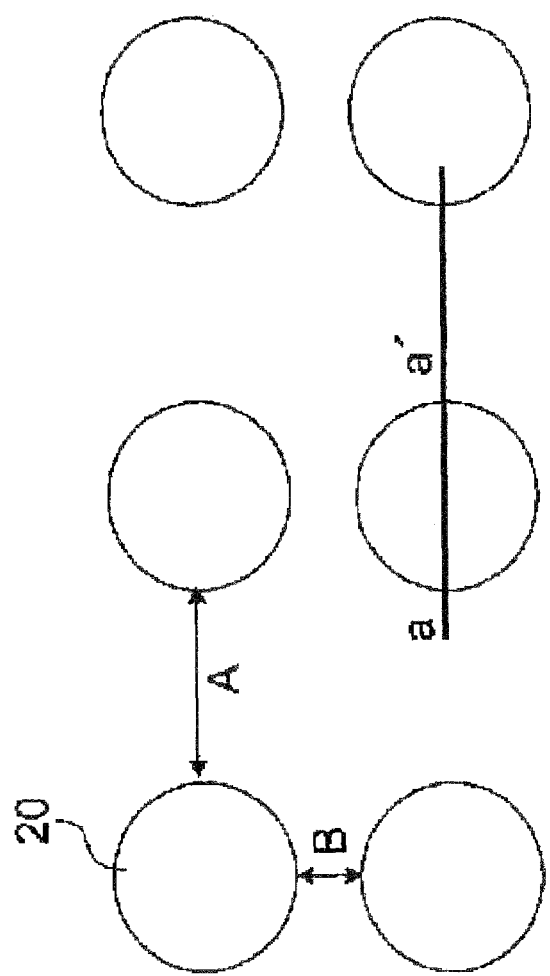
Figures 16A, 16B:
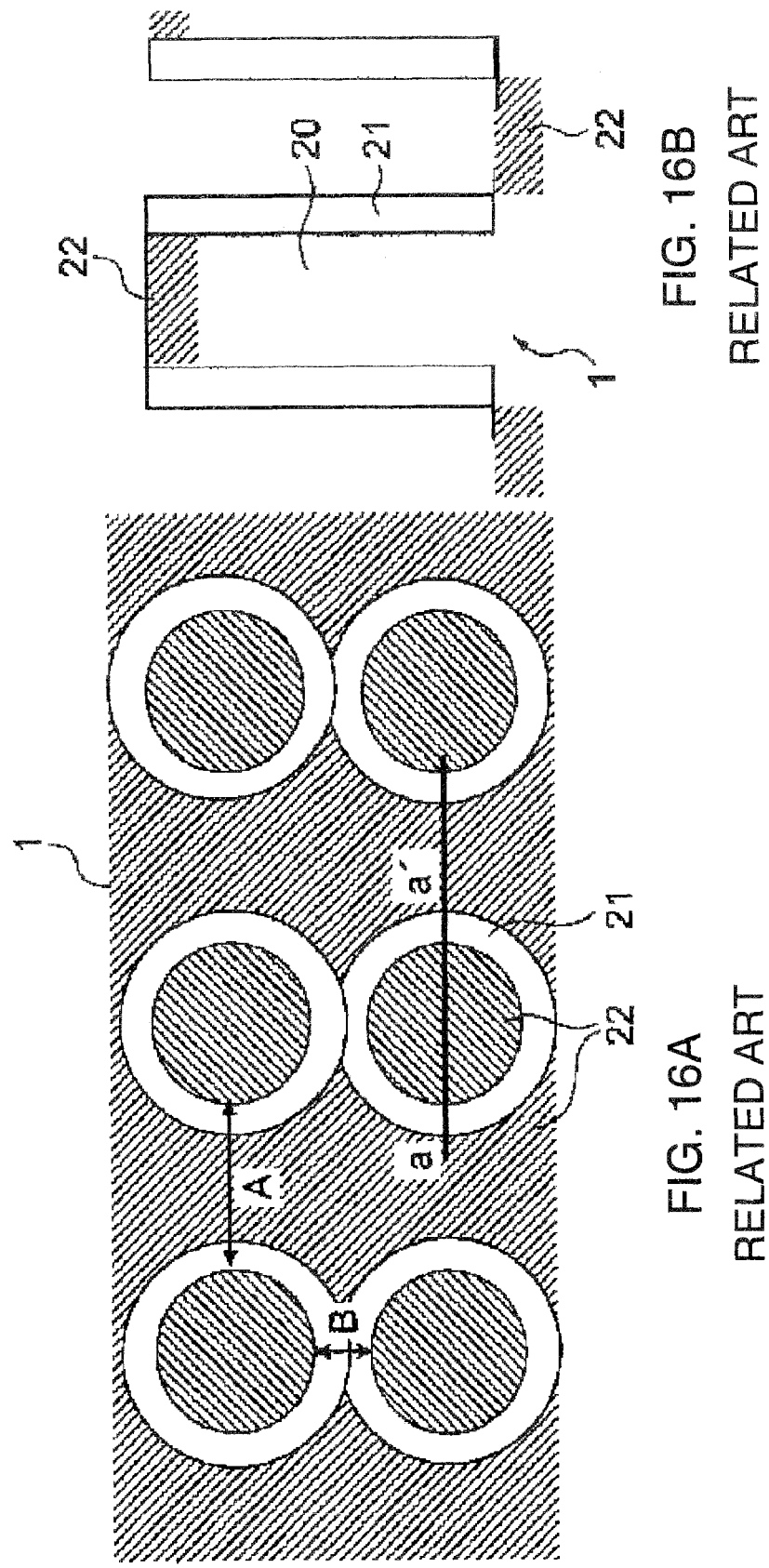
FIGS. 16A and 16B are diagrams illustrating steps of forming a side wall and injecting an impurity after the steps of FIGS. 15A and 15B.
Figures 17A, 17B:
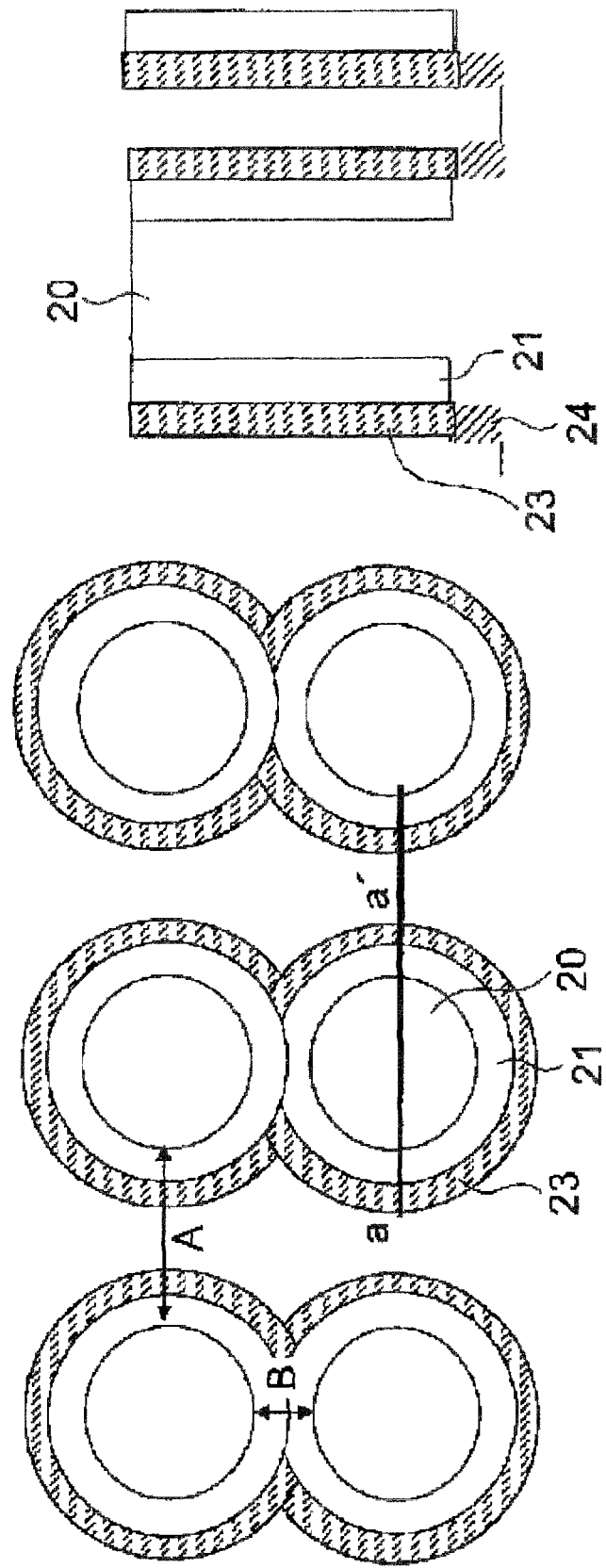
FIGS. 17A and 17B are diagrams illustrating steps of forming a side wall and performing etching after the steps of FIGS. 16A and 16B.

FIGS. 14A to 14C are plan views illustrating a state in which a word line has been formed in self-alignment fashion in a case where A<B holds and mutually adjacent bit lines are staggered by distance B/2. Specifically, since the mask pattern 20d used in FIGS. 14A to 14C is the same as that used in FIGS. 12A to 12C, the spacing of the contact formation regions 4b can be enlarged in comparison with the case where the mask pattern 20b of FIGS. 13A to 13C is used.

At the step shown in FIG. 3 in the exemplary embodiment described above, the silicon of the bridge pattern 3 is completely oxidized by sacrificial oxidation after the oxide film of the side wall 5 is entirely removed by wet etching. However, this does not impose a limitation upon the present invention. That is, without removing the oxide film of the side wall 5, the silicon of the bridge pattern 3 may be completely oxidized by sacrificial oxidation, after which wet etching of the oxide film may be performed and the silicon pattern of FIGS. 4A) 4B obtained. If such an arrangement is adopted, it is possible to reduce the number of steps executed when the bridge pattern 3 is etched away.

Furthermore, with the masks 20b, 20c, 20d used in FIGS. 10 to 14, a case where mutually adjacent bit lines are not staggered, a case where they are staggered by B and a case where they are staggered by B/2 have been illustrated. However, this does not impose a limitation upon the present invention and it is permissible to use a mask that makes possible a layout in which mutually adjacent bit lines are staggered (offset) by a distance greater than zero and less than B. If such an arrangement is adopted, working of the word lines is facilitated and the distance between the contact formation regions 4b can be changed appropriately.

With the method of manufacturing the semiconductor device of the present invention, as described above (termed generally as "mode 1"), it is possible to adopt various modes described below. Specifically, the method may further include a step of oxidizing at least the bridge pattern 3 by thermal oxidation after the execution of the step of removing the side wall 5, and a step of removing the oxidized bridge pattern. (mode 2) Thus, a channel region is formed for every columnar pattern arranged in the two-dimensional array.

The method may further include a step of forming the oxide film 8 that covers the columnar patterns 2 and the surface portion of the silicon substrate 1 after the execution of the step of removing the bridge pattern, and a step of forming row wiring 9, which extends in the row direction on side walls of the columnar patterns and surface of the silicon substrate, on the surface of the oxide film. (mode 3) In this case, operation is possible as a transistor owing to the columnar pattern serving as a channel region, the row wiring formed via the columnar patterns and oxide film, the column wiring and the diffusion region formed in the top portion of the columnar pattern.

At the step of forming the columnar patterns and bridge patterns, the first distance (B) between the columnar patterns mutually adjacent in the column direction connected by the bridge patterns and the second distance (A) between the columnar patterns mutually adjacent in the row direction are made approximately the same. (mode 4) As a result, working of the word lines is facilitated in comparison with a case where the first distance is smaller than the second distance.

At the step of forming the columnar patterns and bridge patterns, the first distance between the columnar patterns mutually adjacent in the column direction connected by the bridge patterns is made larger than the second distance between the columnar patterns mutually adjacent in the row direction. (mode 5) As a result, working of the word lines is facilitated in comparison with a case where the first and second distances are approximately equal.

The columnar patterns mutually adjacent in the row direction are staggered with respect to the column direction by a distance less than the first distance. (mode 6) As a result, the spacing between contacts that contact the diffusion regions formed at the top portions of the columnar patterns can be enlarged.

The semiconductor substrate is a silicon substrate. In this case, buried wiring extending in the column direction of the columnar patterns is formed within the silicon substrate.

As many apparently widely different exemplary embodiments of the present invention can be made without departing from the spirit and scope thereof, it is to be understood that the invention is not limited to the specific exemplary embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method of manufacturing a semiconductor device, comprising:
    forming columnar patterns, which are arranged in a two-dimensional array, and bridge patterns, which connect the columnar patterns in a column direction, on a semiconductor substrate;
    injecting an impurity in a top surface portion of each of the columnar patterns and bridge patterns and in exposed surface portions of the semiconductor substrate, thereby forming diffusion regions;
    forming a side-wall oxide film that covers side surfaces of the columnar patterns and bridge patterns;
    removing the diffusion region from the surface portions of the semiconductor substrate with the exception of the diffusion region covered by the side-wall oxide film; and
    removing the side-wall oxide film;
    wherein diffusion regions left on the semiconductor substrate are adopted as column wiring extending in the column direction.

2. The method according to claim 1, further comprising the steps of:
    oxidizing at least the bridge patterns by a thermal oxidation method following said removing the side-wall oxide film; and
    removing the oxidized bridge patterns.

3. The method according to claim 2, further comprising:

forming an oxide film that covers the columnar patterns and the surface portions of the silicon substrate following said removing the bridge patterns; and forming row wiring, which extends in a row direction on side walls of the columnar patterns and surface of the silicon substrate, on the surface of the oxide film.

4. The method according to claim 1, wherein at said forming the columnar patterns and bridge patterns, a first distance between the columnar patterns mutually adjacent in the column direction connected by the bridge patterns and a second distance between the columnar patterns mutually adjacent in the row direction are made approximately the same.

5. The method according to claim 1, wherein at said forming the columnar patterns and bridge patterns, a first distance between the columnar patterns mutually adjacent in the column direction connected by the bridge patterns is made larger than a second distance between the columnar patterns mutually adjacent in the row direction.

6. The method according to claim 5, wherein the columnar patterns mutually adjacent in the row direction are staggered with respect to the column direction by a distance less than the first distance.

7. The method according to claim 1, wherein the semiconductor substrate is a silicon substrate.

* * * * *